United States Patent
Ahn et al.

(10) Patent No.: US 7,465,631 B2
(45) Date of Patent: Dec. 16, 2008

(54) METHOD OF FABRICATING A NON-VOLATILE MEMORY DEVICE

(75) Inventors: Jung Ryul Ahn, Seoul (KR); Jum Soo Kim, Kyeongki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 174 days.

(21) Appl. No.: 11/634,622

(22) Filed: Dec. 6, 2006

(65) Prior Publication Data
US 2007/0235800 A1 Oct. 11, 2007

(30) Foreign Application Priority Data
Apr. 6, 2006 (KR) .................. 10-2006-0031418

(51) Int. Cl.
*H01L 21/336* (2006.01)
(52) U.S. Cl. .............. 438/257; 438/258; 438/261; 257/314; 257/325
(58) Field of Classification Search ............. 438/257, 438/258, 261; 257/314, 325
See application file for complete search history.

(56) References Cited

U.S. PATENT DOCUMENTS

| | | | |
|---|---|---|---|
| 5,886,378 A | 3/1999 | Wang | |
| 5,932,909 A | 8/1999 | Kato et al. | |
| 6,744,097 B2 | 6/2004 | Yoo | |
| 7,022,592 B2 * | 4/2006 | Chu et al. | 438/488 |
| 2004/0029389 A1 * | 2/2004 | Lo | 438/694 |
| 2007/0047304 A1 * | 3/2007 | Lee et al. | 365/185.05 |
| 2007/0111441 A1 * | 5/2007 | Koh et al. | 438/257 |

FOREIGN PATENT DOCUMENTS

| | | |
|---|---|---|
| KR | 10-1999-0057083 A | 7/1999 |
| KR | 10-2001-0011708 A | 2/2001 |
| KR | 10-2001-0065283 A | 7/2001 |
| KR | 10-2005-0004123 A | 1/2005 |

* cited by examiner

*Primary Examiner*—Phuc T Dang
(74) *Attorney, Agent, or Firm*—Marshall, Gerstein & Borun LLP

(57) ABSTRACT

A non-volatile memory device and a method of manufacturing the same, in which the program speed can be enhanced and the interference phenomenon can be reduced. The non-volatile memory device includes a semiconductor substrate having an active region defined by isolation layers arranged in one direction, a control gate arranged vertically to the direction in which the isolation layers are arranged, a floating gate formed on the active region below the control gate and having a lateral curve so that the floating gate has a width narrowed upwardly, a gate insulating layer formed between the floating gate and the semiconductor substrate, and a dielectric layer formed between the floating gate and the control gate.

6 Claims, 5 Drawing Sheets

METHOD OF FABRICATING A NON-VOLATILE MEMORY DEVICE

BACKGROUND OF THE INVENTION

The invention relates in general to non-volatile memory devices, and, more particularly, to a non-volatile memory device and a method of manufacturing the same wherein the program speed can be enhanced and interference phenomena can be reduced.

A non-volatile memory device is a device that stores and reads information according to the movement of the threshold voltage in a state where electrons are injected into the floating gate and a state where electrons are not injected into the floating gate.

The program speed of the non-volatile memory device is greatly influenced by the coupling ratio (i.e., an index indicating what percentage of a bias applied to the control gate is applied to the floating gate). The coupling ratio tends to be proportional to the capacitance between the control gate and the floating gate. In order to improve the program speed, an overlapping area between the control gate and the floating gate must be increased.

FIG. 1 is a cross-sectional view of a conventional non-volatile memory device.

Referring to FIG. 1, the conventional non-volatile memory device includes a semiconductor substrate 10, a floating gate 15, and a control gate 17. The semiconductor substrate 10 includes active regions defined by isolation layers 13 of a shallow trench structure. The floating gate 15 includes first polysilicon layers 12 laminated on the active regions with gate insulating layers 11 dispersed between the first polysilicon layers 12 and the semiconductor substrate 10, and second polysilicon layers 14 formed on the first polysilicon layers 12 and predetermined regions of the isolation layers 13 adjacent to the first polysilicon layers 12. The control gate 17 is formed on the floating gate 15 with a dielectric layer 16 of an ONO (oxide-nitride-oxide) structure disposed therebetween.

The non-volatile memory device described above is advantageous in improving the program speed because the size of an overlapping area between the floating gate 15 and the control gate 17 is increased due to the thickness of the second polysilicon layer 14. However, an overlapping area between floating gates adjacent in a bit line direction is increased and a distance between floating gates adjacent in a word line direction becomes smaller than a width of the isolation layer 13 due to the second polysilicon layer 14. Accordingly, the interference phenomenon is increased.

In the interference phenomenon, the threshold voltage of a reference cell is varied depending on whether neighboring cells are eased or programmed. If the interference phenomenon is increased, cell distributions are widened and the characteristic and uniformity of a device becomes difficult, resulting in read failure.

SUMMARY OF THE INVENTION

In one embodiment, the invention relates to a non-volatile memory device and a method of manufacturing the same, in which the program speed can be enhanced and the interference phenomenon can be reduced.

A non-volatile memory device according to one aspect of the invention includes a semiconductor substrate having an active region defined by isolation layer, a control gate arranged vertically to the direction in which the isolation layer is arranged, a floating gate formed on the active region below the control gate and having a lateral curve so that the floating gate has a width narrowed in the upward direction, a gate insulating layer formed between the floating gate and the semiconductor substrate, and a dielectric layer formed between the floating gate and the control gate.

A method of fabricating a non-volatile memory device according to another aspect of the invention includes the steps of forming a gate insulating layer, a floating gate layer, and a hard mask layer over a semiconductor substrate, forming a trench to etch floating gate layer, gate insulating layer and the semiconductor substrate, recessing the hard mask layer so that both edges of the floating gate layer are exposed, etching the floating gate layer using the recessed hard mask layer, depositing an isolation material to fill the trench, removing the hard mask layer, and forming a dielectric layer, and a control gate layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The invention will now be described in detail in connection with certain exemplary embodiments with reference to the accompanying drawings.

Figure 1:
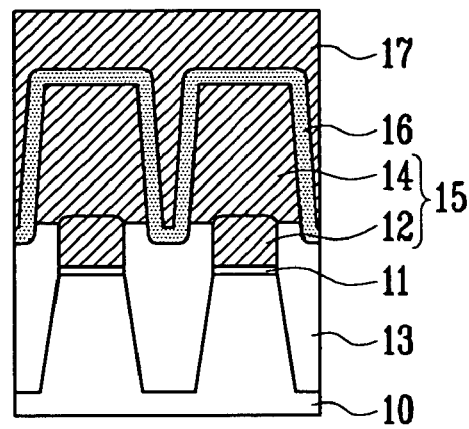
FIG. 1 is a cross-sectional view of a conventional non-volatile memory device.
Figure 2:
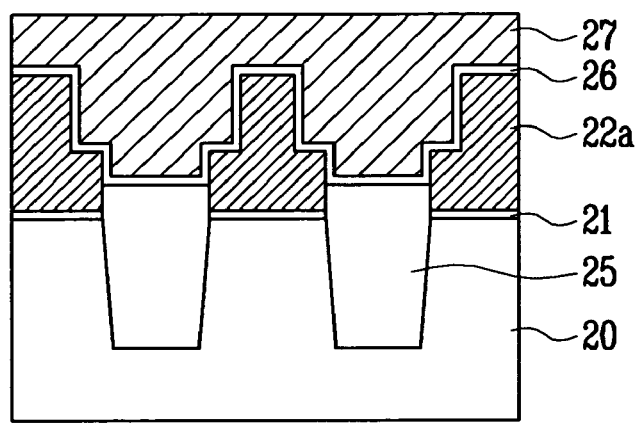
FIG. 2 is a cross-sectional view of a non-volatile memory device according to a first embodiment of the invention.

FIG. 2 is a cross-sectional view of a non-volatile memory device according to a first embodiment of the invention.

The non-volatile memory device according to the embodiment includes a floating gate 22a having a lateral curve so that it has a width narrowed in the upward direction.

In more detail, a semiconductor substrate 20 is divided into an active region and a field region by a plurality of isolation layers 25 arranged in a bit line direction. A plurality of control gates 27 arranged in a word line direction vertical to the bit line direction are formed over the semiconductor substrate 20. The floating gates 22a respectively having a stair-shaped lateral curve whose width is narrowed upwardly on the active region under the control gate 27.

Gate insulating layers 21 are formed on the semiconductor substrate 20 of the active region, thus separating the semiconductor substrate 20 and the floating gates 22a. The floating gates 22a and the control gate 27 are insulated by a dielectric layer 26 with it being disposed therebetween.

A method of manufacturing the non-volatile memory device constructed above according to the first embodiment will be described below.

FIGS. 3A to 3E are cross-sectional views illustrating a method of manufacturing the non-volatile memory device according to the first embodiment of the invention.

Figure 3A:
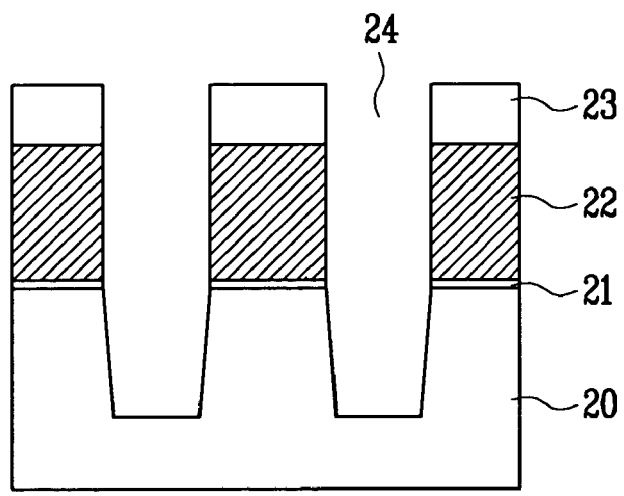
FIGS. 3A to 3E are cross-sectional views illustrating a method of manufacturing the non-volatile memory device according to the first embodiment of the invention.

Referring first to FIG. 3A, the gate insulating layer 21, a conductive layer for a floating gate 22, and a first hard mask layer 23 are sequentially formed on the semiconductor substrate 20. The first hard mask layer 23 may be preferably formed using a nitride layer.

The first hard mask layer 23 is then patterned by a photolithography process. The conductive layer for the floating gate 22, the gate insulating layer 21, and the semiconductor substrate 20 are etched to a predetermined depth using the patterned first hard mask layer 23 as an etch mask, thereby forming a plurality of trenches for isolation 24 arranged in the bit line direction.

Figure 3B:
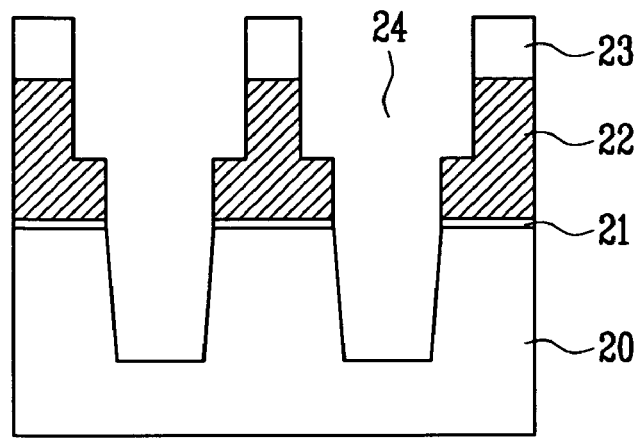

Referring next to FIG. 3B, the first hard mask layer 23 is recessed so that both edges of the conductive layer for the floating gate 22 are exposed. The exposed conductive layer for the floating gate 22 is etched to a predetermined thickness using the recessed first hard mask layer 23 as a mask. Accordingly, the conductive layer for the floating gate 22 has a stair-shaped lateral curve and has a width narrowed in the upward direction.

Figure 3C:
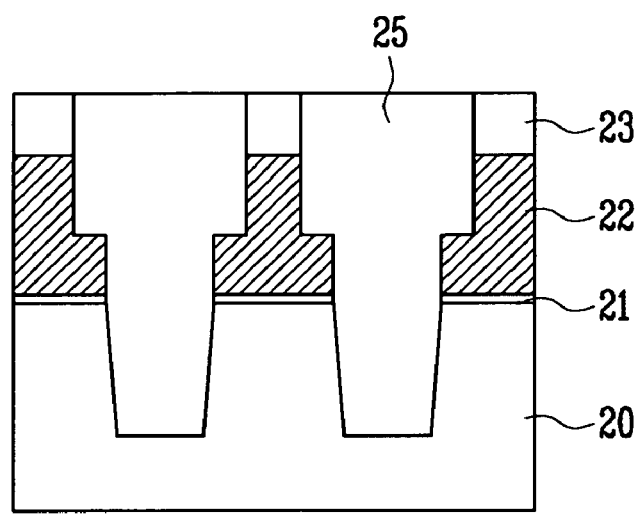

Referring to FIG. 3C, an oxide layer is deposited on the entire surface so that the trenches for isolation 24 are gap-filled. The oxide layer is removed to expose the first hard mask layer 23, thus forming the isolation layer 25.

Figure 3D:
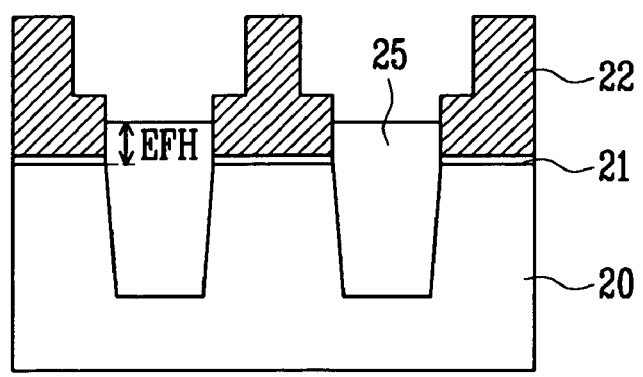

Referring to FIG. 3D, the first hard mask layer 23 is removed. At this time, the isolation layer 25 is also etched to a predetermined thickness, so that the EFH (effective field height) of the isolation layer 25 is lowered.

Figure 3E:
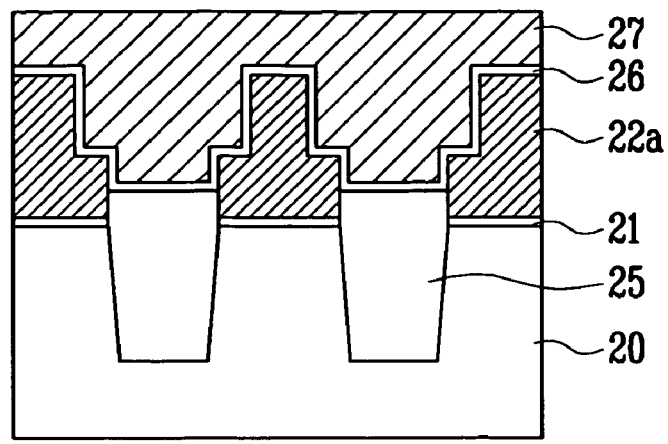

Referring to FIG. 3E, a dielectric layer and a conductive layer for a control gate are formed on the entire surface. The conductive layer for the control gate, the dielectric layer, and the conductive layer for the floating gate 22 are patterned in a word line direction vertical to a direction in which the isolation layers 25 are arranged, thus forming a gate of a structure in which the floating gates 22a, the dielectric layer 26, and the control gate 27 are laminated.

If the stair-shaped lateral curve is formed in the floating gate 22a so that the width of the floating gate 22a is narrowed upwardly as in the first embodiment, an overlapping area between the floating gate 22a and the control gate 27 is increased and an overlapping area between the floating gates 22a adjacent in the bit line direction and a diagonal direction is reduced.

If an overlapping area between the floating gate 22a and the control gate 27 is increased, the coupling ratio is increased and the program speed is enhanced. If an overlapping area between the floating gates 22a is reduced, the interference phenomenon is decreased. Accordingly, if the first embodiment is applied, the program speed can be improved and the interference phenomenon can be reduced.

Figure 4:
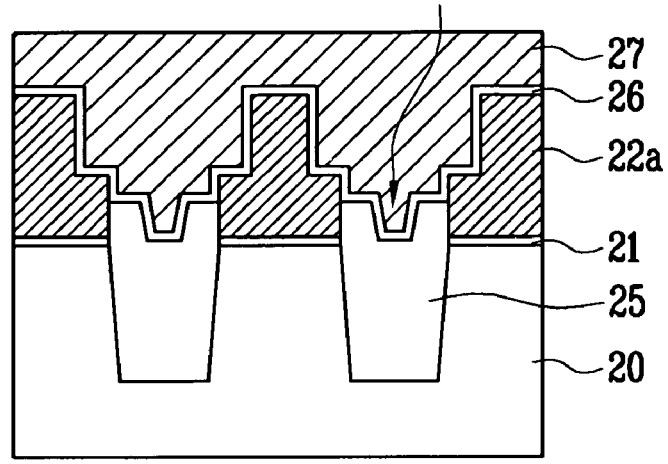
FIG. 4 is a cross-sectional view of a non-volatile memory device according to a second embodiment of the non-volatile memory device of the invention.

FIG. 4 a cross-sectional view of a non-volatile memory device according to a second embodiment of the non-volatile memory device of the invention.

The non-volatile memory device of the embodiment of FIG. 4 includes a floating gate 22a having a lateral curve so that it has a width narrowed upwardly, and trenches 29, which are arranged in a bit line direction and are respectively formed in isolation layers 25 that divide a semiconductor substrate 20 into a field region and an active region.

In more detail, the isolation layers 25 are arranged in the bit line direction and divide the semiconductor substrate 20 into the field region and the active region. The trenches 29 are formed in the same direction in which the isolation layers 25 are arranged. A plurality of control gates 27 arranged in a word line direction vertical to the bit line direction are formed over the semiconductor substrate 20. The floating gates 22a respectively having a stair-shaped lateral curve whose width is narrowed upwardly on the active region under the control gate 27.

Gate insulating layers 21 are formed on the semiconductor substrate 20 of the active region, thus separating the semiconductor substrate 20 and the floating gates 22a. The floating gates 22a and the control gate 27 are insulated by a dielectric layer 26 disposed therebetween.

A method of manufacturing the non-volatile memory device constructed above according to the second embodiment will be described below.

FIGS. 5A to 5G are cross-sectional views illustrating a method of manufacturing the non-volatile memory device according to the second embodiment of the invention.

Figure 5A:
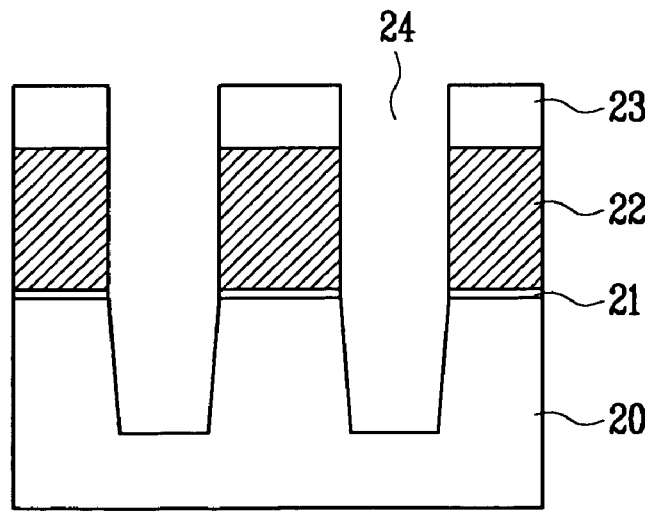
FIGS. 5A to 5G are cross-sectional views illustrating a method of manufacturing the non-volatile memory device according to the second embodiment of the invention.

Referring first to FIG. 5A, the gate insulating layer 21, a conductive layer for a floating gate 22, and a first hard mask layer 23 are sequentially formed on the semiconductor substrate 20. The first hard mask layer 23 may preferably be formed using a nitride layer.

The first hard mask layer 23 is then patterned by a photolithography process. The conductive layer for the floating gate 22, the gate insulating layer 21, and the semiconductor substrate 20 are etched to a predetermined depth using the patterned first hard mask layer 23 as an etch mask, thereby forming a plurality of trenches for isolation 24 arranged in the bit line direction.

Figure 5B:
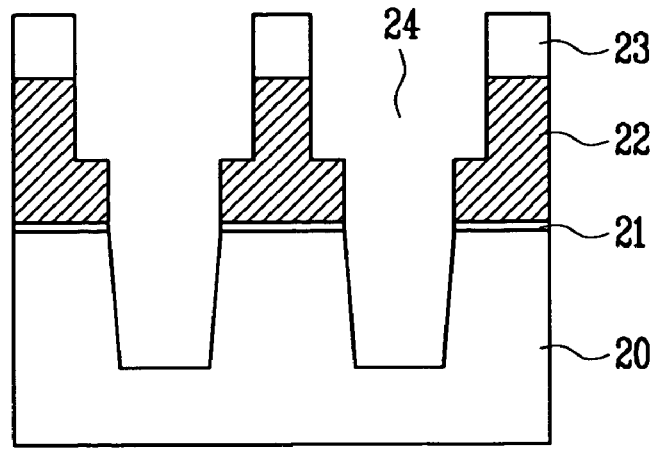

Referring next to FIG. 5B, the first hard mask layer 23 is recessed so that both edges of the conductive layer for the floating gate 22 are exposed. The exposed conductive layer for the floating gate 22 is etched to a predetermined thickness using the recessed first hard mask layer 23 as a mask. Accordingly, the conductive layer for the floating gate 22 has a stair-shaped lateral curve and has a width narrowed upwardly.

Figure 5C:
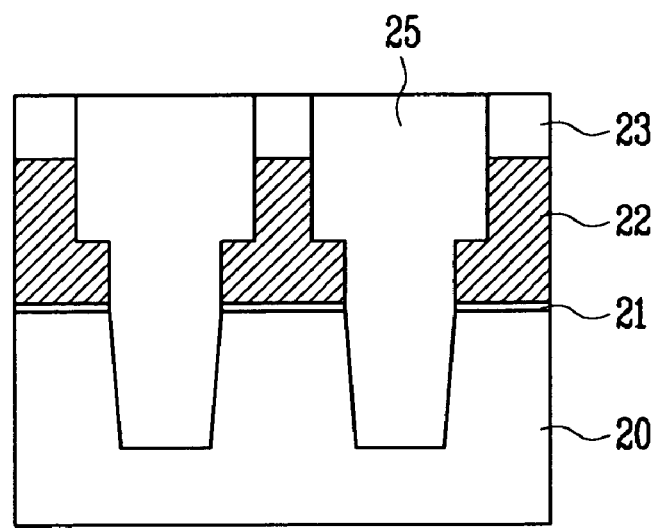

Referring to FIG. 5C, an oxide layer is deposited on the entire surface so that the trenches for isolation 24 are gap-filled. The oxide layer is removed to expose the first hard mask layer 23, thus forming the isolation layer 25.

Figure 5D:
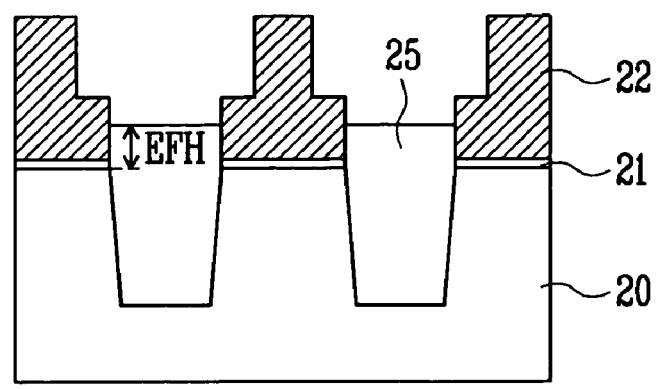

Referring to FIG. 5D, the first hard mask layer 23 is removed. At this time, the isolation layer 25 is also etched to a predetermined thickness, so that the EFH (effective field height) of the isolation layer 25 is lowered.

Figure 5E:
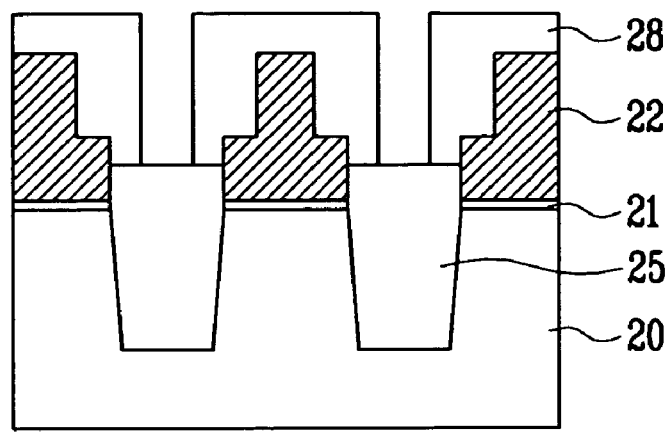

Referring to FIG. 5E, a second hard mask layer 28 is formed on the entire surface. The second hard mask layer 28 is patterned by a photolithography process so that the isolation layers 25 are exposed in a line form along its arrangement direction.

Figure 5F:
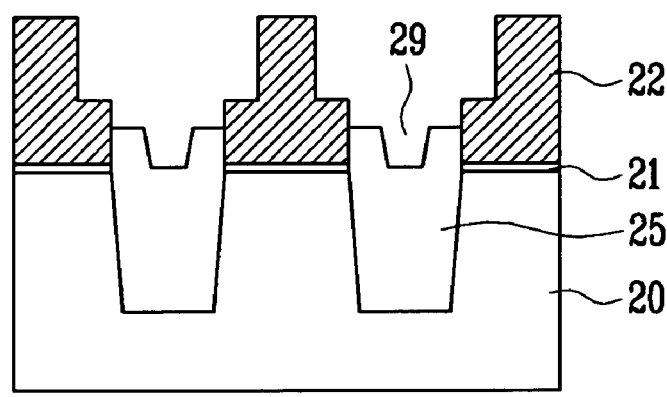

Referring to FIG. 5F, the isolation layers 25 are etched using the patterned second hard mask layer 28 as a mask, forming trenches 29. The second hard mask layer 28 is then removed.

Figure 5G:
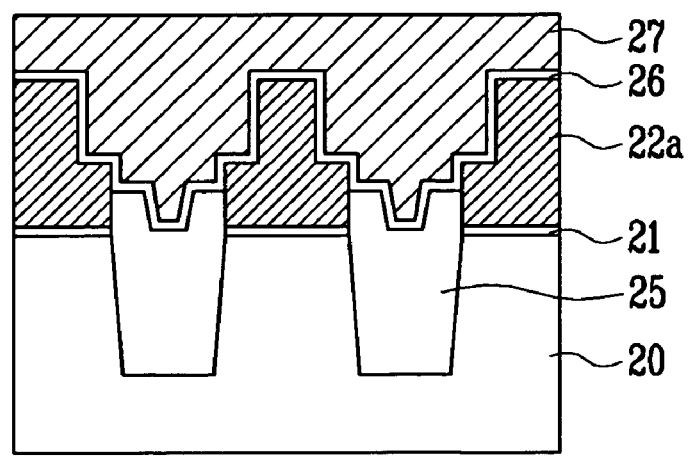

Referring to FIG. 5G, a dielectric layer and a conductive layer for a control gate are formed on the entire surface. The conductive layer for the control gate, the dielectric layer, and the conductive layer for the floating gate 22 are patterned in a word line direction vertical to a direction in which the isolation layers 25 are arranged, thus forming a gate of a structure in which the floating gates 22a, the dielectric layer 26, and the control gate 27 are laminated.

In the second embodiment, it has been described that the stair-shaped lateral curve is formed in the floating gate 22a so that the width of the floating gate 22a is narrowed upwardly. However, the trenches 29 may be formed in the isolation layers 25, respectively, in order to increase an electrical distance between the floating gates 22a adjacent in the word line direction.

Accordingly, not only the interference between the floating gates 22a adjacent in the bit line direction and the diagonal direction, but also the interference between the floating gates 22a adjacent in the word line direction can be reduced.

In the embodiments described above, an example in which the number of the lateral curve of the floating gate 22a is one has been described. However, the number of the lateral curve of the floating gate 22a may be two or more. This can be implemented by repeatedly performing the process of recessing the first hard mask layer 23 and the process of etching the conductive layer for the floating gates 22 to a predetermined thickness using the recessed first hard mask layer 23 as a mask.

As described above, the invention has the following advantages.

First, the stair-shaped lateral curve is formed in the floating gate. Therefore, not only an overlapping area between the floating gate and the control gate can be extended, but also the interference between the floating gates adjacent in the bit line and the diagonal direction can be reduced. Accordingly, the program speed can be improved and the interference phenomenon can be reduced at the same time.

Second, the trenches are formed in the same direction in which the isolation layers are arranged. Therefore, an electrical distance between the floating gates adjacent in the word line direction can be extended. Accordingly, the interference between the floating gates adjacent in the word line direction can be reduced.

Third, since the interference phenomenon can be reduced, read failure can be prevented.

While the invention has been described in connection with practical exemplary embodiments, the invention is not limited to the disclosed embodiments but, to the contrary, is intended to cover various modifications and equivalent arrangements included within the spirit and scope of the appended claims.

What is claimed is:

1. A method of fabricating a non-volatile memory device, the method comprising the steps of:
    forming a gate insulating layer, a floating gate layer, and a hard mask layer over a semiconductor substrate;
    forming a trench to etch floating gate layer, gate insulating layer and the semiconductor substrate;
    recessing the hard mask layer so that both edges of the floating gate layer are exposed;
    etching the floating gate layer using the recessed hard mask layer;
    depositing an isolation material to fill the trench;
    removing the hard mask layer; and
    forming a dielectric layer, and a control gate layer.

2. The method of claim 1, further comprising the step of forming trenches of a line shape in a direction in which the isolation layers are arranged before forming the dielectric layer the control gate layer.

3. The method of claim 1, comprising performing recessing the hard mask and etching the floating gate layer only once.

4. The method of claim 1, comprising performing recessing the hard mask and etching the floating gate layer at least twice.

5. The method of claim 1, further comprising the step of forming a gate by etching predetermined portions of the conductive layer for the control gate, the dielectric layer, and the conductive layer for the floating gate after forming the dielectric layer the control gate layer.

6. The method of claim 1, wherein when the hard mask is removed, the isolation material is etched to a predetermined thickness.

* * * * *